(12) United States Patent
Xie et al.

(10) Patent No.: US 11,107,726 B2
(45) Date of Patent: Aug. 31, 2021

(54) METHOD FOR MANUFACTURING BONDING PAD IN SEMICONDUCTOR DEVICE

(71) Applicant: Wuhan Xinxin Semiconductor Manufacturing Co., Ltd., Hubei (CN)

(72) Inventors: Yan Xie, Hubei (CN); Xuanjun Liu, Hubei (CN)

(73) Assignee: Wuhan Xinxin Semiconductor Manufacturing Co., Ltd., Hubei (CN)

( * ) Notice: Subject to any disclaimer, the term of this patent is extended or adjusted under 35 U.S.C. 154(b) by 0 days.

(21) Appl. No.: 16/584,188

(22) Filed: Sep. 26, 2019

(65) Prior Publication Data

US 2021/0020498 A1 Jan. 21, 2021

(30) Foreign Application Priority Data

Jul. 17, 2019 (CN) .......................... 201910647015.X (51) Int. Cl.
*H01L 21/768* (2006.01)
*H01L 21/027* (2006.01)
(Continued)

(52) U.S. Cl.
CPC .... *H01L 21/76814* (2013.01); *H01L 21/0274* (2013.01); *H01L 21/0332* (2013.01);
(Continued)

(58) Field of Classification Search
CPC ........... H01L 21/76814; H01L 21/0274; H01L 21/0332; H01L 21/0337; H01L 21/3213; H01L 21/76829
(Continued)

(56) References Cited

U.S. PATENT DOCUMENTS 5,741,741 A * 4/1998 Tseng ................ H01L 21/31144
257/E21.257
7,534,721 B2 5/2009 Kanamura
(Continued)

FOREIGN PATENT DOCUMENTS

| CN | 1166055 A * | 11/1997 | ....... H01L 21/76813 |
| CN | 101123214 A * | 2/2008 | |
| WO | WO-2004012254 A1 * | 2/2004 | ....... H01L 21/76813 |

OTHER PUBLICATIONS

First Chinese Office Action regarding Application No. 201910647015.X dated Jan. 28, 2021. English translation provided by Unitalen Attorneys at Law.

*Primary Examiner* — Allen L Parker
*Assistant Examiner* — David W Houston, III
(74) *Attorney, Agent, or Firm* — Harness, Dickey & Pierce, P.L.C.

(57) ABSTRACT

A method for manufacturing a semiconductor device is provided. A substrate is provided, where a cover layer is formed on the substrate, a wiring layer is formed in the cover layer, a layer to be etched is formed on the cover layer, and the layer to be etched includes an adhesive layer. An exposure patterned film layer is formed on the layer to be etched. A first etching hole pattern is formed in the exposure patterned film layer. The layer to be etched is etched to form a blind hole by using the exposure patterned film layer as a mask. The exposure patterned film layer is trimmed to form a second etching hole pattern. The layer to be etched is further etched to form a bonding hole by using the trimmed exposure patterned film layer as a mask. A bonding pad is formed in the bonding hole.

6 Claims, 10 Drawing Sheets

(51) Int. Cl.
  *H01L 21/033* (2006.01)
  *H01L 21/3213* (2006.01)
(52) U.S. Cl.
  CPC ...... *H01L 21/0337* (2013.01); *H01L 21/3213* (2013.01); *H01L 21/76829* (2013.01)
(58) Field of Classification Search
  USPC .......................................................... 438/637
  See application file for complete search history.

(56) References Cited

U.S. PATENT DOCUMENTS

| | | | |
|---|---|---|---|
| 9,659,821 B1* | 5/2017 | Chen | H01L 21/76816 |
| 9,685,404 B2* | 6/2017 | Bao | H01L 21/76811 |
| 2006/0166482 A1* | 7/2006 | Kanamura | H01L 21/76813 |
| | | | 438/623 |
| 2008/0026563 A1 | 1/2008 | Kanamura | |
| 2009/0197422 A1* | 8/2009 | Kang | H01L 21/76808 |
| | | | 438/717 |
| 2012/0129337 A1* | 5/2012 | Chen | H01L 21/76811 |
| | | | 438/636 |
| 2013/0183825 A1* | 7/2013 | Liou | H01L 21/76807 |
| | | | 438/675 |
| 2016/0155664 A1* | 6/2016 | Chan | H01L 21/3212 |
| | | | 438/643 |
| 2016/0291472 A1* | 10/2016 | Shin | G03F 7/094 |
| 2017/0287780 A1* | 10/2017 | Park | H01L 27/0924 |
| 2018/0240699 A1* | 8/2018 | Chan | H01L 21/76816 |
| 2019/0035929 A1* | 1/2019 | Syue | H01L 29/42368 |
| 2019/0164914 A1* | 5/2019 | Hu | H01L 24/08 |
| 2020/0176253 A1* | 6/2020 | Liou | H01L 21/02348 |
| 2020/0176307 A1* | 6/2020 | Shih | H01L 27/0924 |
| 2020/0328223 A1* | 10/2020 | Lai | H01L 21/76811 |

\* cited by examiner

METHOD FOR MANUFACTURING BONDING PAD IN SEMICONDUCTOR DEVICE

The present application claims priority to Chinese Patent Application No. 201910647015.X, titled "METHOD FOR MANUFACTURING SEMICONDUCTOR DEVICE", filed on Jul. 17, 2019 with the China National Intellectual Property Administration, which is incorporated herein by reference in its entirety.

FIELD

The present disclosure relates to the technical field of semiconductor devices and manufacture thereof, and in particular to, a method for manufacturing a semiconductor device.

BACKGROUND

Currently, a bonding pad is normally formed by a damascene process of filling a formed bonding hole with a metal material. To form the bonding hole, a bottom via hole and an upper via hole of the bonding pad are formed by two masks and two photolithography and etching processes, resulting in a high cost of the manufacture. Therefore, it is desired to further reduce the manufacturing cost, to increase the productivity and improve the efficiency.

SUMMARY

In view of the above, a method of manufacturing a semiconductor device is provided to reduce the manufacturing cost.

A method for manufacturing a semiconductor device includes:

providing a substrate, where a cover layer of a dielectric material is formed on the substrate, a wiring layer is formed in the cover layer, a layer to be etched is formed on the cover layer, and the layer to be etched includes an adhesive layer;

forming an exposure patterned film layer on the layer to be etched and performing a photolithography process to form a first etching hole pattern in the exposure patterned film layer;

performing a first etching process on the layer to be etched to form a blind hole in the layer to be etched by using the exposure patterned film layer as a mask;

trimming the exposure patterned film layer to expand the first etching hole pattern to form a second etching hole pattern;

performing a second etching process on the layer to be etched to form a bonding hole by using the trimmed exposure patterned film layer as a mask, where the bonding hole includes a bottom via hole and an upper via hole, the bottom via hole is formed by using the blind hole and extends to the wiring layer, the upper via hole extends through a part of thickness of the layer to be etched and is formed in the layer to be etched between the bottom via hole and the second etching hole pattern; and forming a bonding pad in the bonding hole.

In some embodiments, the exposure patterned film layer includes an amorphous carbon mask layer and a photoresist layer on the amorphous carbon mask layer.

In some embodiments, the amorphous carbon mask layer is made of an Advanced Patterning Film (APF), an Organic Under Layer (ODL) or Spin on Carbon (SoC).

In some embodiments, a dielectric anti-reflective layer is further arranged between the amorphous carbon mask layer and the photoresist layer. Before or during the second etching process, the method further includes: removing the dielectric anti-reflective layer.

In some embodiments, the photoresist layer is removed in the first etching process.

In some embodiments, the layer to be etched is in a stacked structure, and the second etching process includes multiple etching steps.

In some embodiments, the adhesive layer includes a first adhesive layer and a second adhesive layer on the first adhesive layer, and the layer to be etched further includes a protective layer on the second adhesive layer.

In some embodiments, a material of the first adhesive layer is silicon oxide, a material of the second adhesive is Nitrogen doped Silicon Carbide (NDC), and a material of the protective layer is silicon oxide.

In some embodiments, after the first etching process, the blind hole extends through the protective layer, and extends through a part of thickness of the second adhesive layer.

In some embodiments, a diffusion stop layer is formed between the first adhesive layer and the cover layer; and the second etching process includes:

transferring the second etching hole pattern to the protective layer;

etching the second adhesive layer until the blind hole extends to the first adhesive layer, and forming an upper opening extending through a part of thickness of the second adhesive layer around the blind hole;

etching the first adhesive layer under the blind hole until the blind extends to the diffusion stop layer; and etching the second adhesive layer under the upper opening to form the upper via hole, and etching the diffusion stop layer under the blind hole to form the bottom via hole.

In the method for manufacturing a semiconductor device according embodiments of the present disclosure, a substrate is provided, where a cover layer of a dielectric material is formed on the substrate, a wiring layer is formed in the cover layer, a layer to be etched is formed on the cover layer, and the layer to be etched includes an adhesive layer. An exposure patterned film layer is formed on the layer to be etched. A first etching hole pattern is formed in the exposure patterned film layer. A first etching process is performed on the layer to be etched to form a blind hole in the layer to be etched by using the exposure patterned film layer as a mask. The exposure patterned film layer is trimmed to expand the first etching hole pattern to form a second etching hole pattern. A second etching process is performed on the layer to be etched to form a bonding hole by using the trimmed exposure patterned film layer as a mask. A bonding pad is formed in the bonding hole. That is, by the embodiments in the present disclosure, the bonding hole can be formed by etching after performing only one photolithography process. Compared with the conventional techniques, which requires two photolithography processes with two masks, the number of photolithography processes is reduced, thereby reducing the manufacturing cost and improving productivity and efficiency.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

DETAILED DESCRIPTION OF EMBODIMENTS

In order to make the above objects, features and advantages of the present disclosure clearer, embodiments of the present disclosure will be described in detail below in conjunction with the drawings.

Many specific details are set forth in the following description in order to provide a thorough understanding of the present disclosure, but the present disclosure may be practiced otherwise. A person skilled in the art can make similar embodiments without departing from the spirit of the present disclosure, and thus the present disclosure is not limited by the specific embodiments disclosed below.

Further, the present disclosure will be described in detail in conjunction with the drawings. In the detailed description of the embodiments of the present disclosure, the cross-sectional view of the structure of the device is partially enlarged not in proportion, the schematic diagram is only used for illustration, and the scope of protection of the present disclosure should not be limited hereto. In addition, the actual three-dimensional dimensions of length, width and depth should be included in the actual production.

As described in the Background, a bonding pad is normally formed by a damascene process of forming a bonding hole and then filling the bonding hold with a metal material. The bonding hole may include a bottom via hole extending to a wiring layer and an upper via hole above the bottom via hole, where a diameter of the upper via hole is larger than that of the bottom via hole. Therefore, in forming the bonding hole, it is required to form the bottom via hole and the upper via hole respectively by two masks and two photolithography and etching processes, resulting in a high cost of the manufacturing process.

In order to solve the above technical problem, a method for manufacturing a semiconductor device is provided in embodiments of the present disclosure. In the method, a substrate is provided, where a cover layer of a dielectric material is formed on the substrate, a wiring layer is formed in the cover layer, a layer to be etched is formed on the cover layer, and the layer to be etched includes an adhesive layer. An exposure patterned film layer is formed on the layer to be etched. A first etching hole pattern is formed in the exposure patterned film layer. A first etching process is performed on the layer to be etched to form a blind hole in the layer to be etched by using the exposure patterned film layer as a mask. The exposure patterned film layer is trimmed to expand the first etching hole pattern to form a second etching hole pattern. A second etching process is performed on the layer to be etched to form a bonding hole by using the trimmed exposure patterned film layer as a mask. A bonding pad is formed in the bonding hole. That is, by the embodiments in the present disclosure, the bonding hole can be formed by etching after performing only one photolithography process to form the first etching hole pattern on the exposed patterned film layer and performing only one trimming process to form the second etching hole pattern on the exposed patterned film layer. Compared with the conventional techniques, which requires two photolithography processes with two masks, the number of photolithography processes is reduced, thereby reducing the manufacturing cost and improving productivity and efficiency.

In order to better understand the technical solutions and technical effects of the present disclosure, specific embodiments will be described in detail below with reference to FIGS. 1-11.

Figure 1:
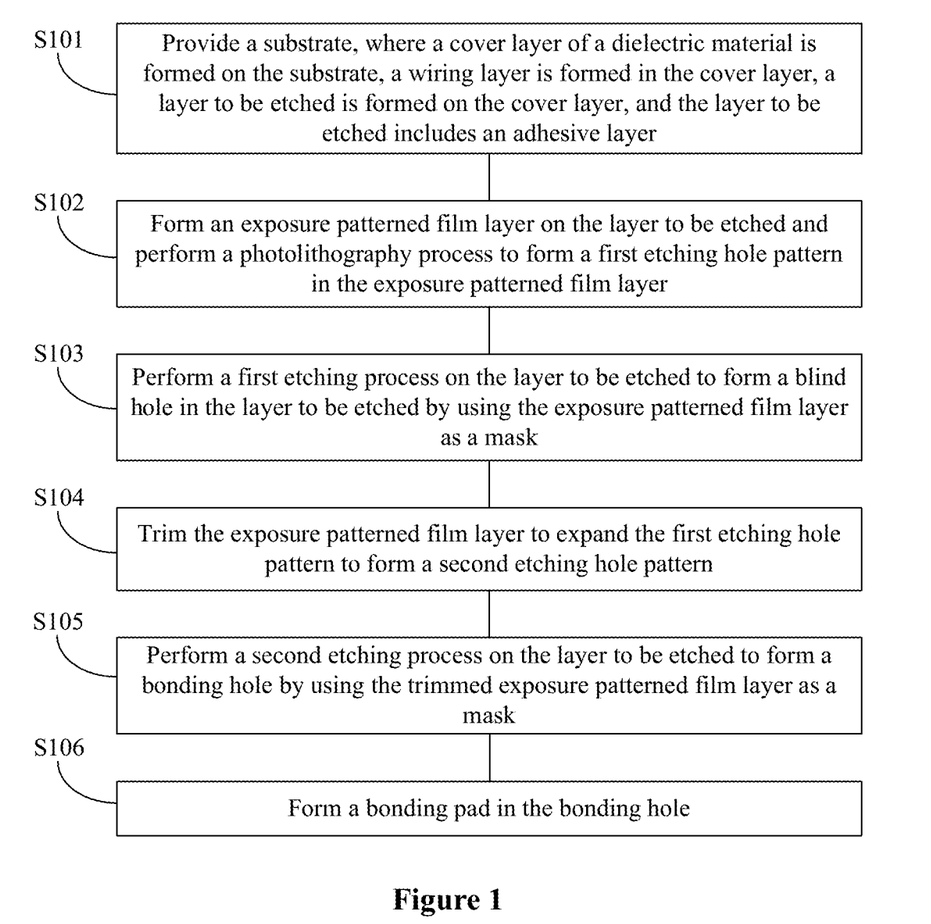
FIG. 1 is a flowchart of a method for manufacturing a semiconductor device according to an embodiment of the present disclosure.

FIG. 1 is a flowchart of a method for manufacturing a semiconductor device according an embodiment of the present disclosure. The method includes the following steps 101 to 106.

In step S101, a substrate 100 is provided, where a cover layer 120 of a dielectric material is formed on the substrate 100, a wiring layer 122 is formed in the cover layer 120, and a layer to be etched is formed on the cover layer 120. The layer to be etched includes an adhesive layer 140, 142.

In the embodiment of the present disclosure, the substrate 100 is a semiconductor substrate, such as a Si substrate, a Ge substrate, a SiGe substrate, an SOI (Silicon On Insulator) substrate, or a GOI (Germanium On Insulator) substrate. In other embodiments, the substrate 100 may be a substrate made of a semiconductor material of other element or compound, such as GaAs, InP or SiC, and may be in a stacked structure, such as a stacked structure of Si and SiGe layers, or other extended structures, such as a structure of SGOI (SiGe on insulator). In the present embodiment, the substrate 100 may be a silicon substrate.

The substrate 100 has already subjected to all processes prior to the process of forming a bonding layer. For example, the substrate 100 is already formed with a device structure and an interconnection layer electrically connected to the device structure. The device structure is covered by an interlayer dielectric layer 110, which may be made of silicon oxide. The device structure may be a MOS device, a memory device, a sensor device, and/or other passive devices. The interconnection layer is formed in the dielectric material. The interconnection layer may include a contact plug, a via hole, or a connection layer, and may include multiple layers. The interconnection layer may be made of a metallic material such as tungsten, aluminum or copper. In the drawings of the present disclosure, only the topmost wiring layer 122 is illustrated for the sake of simplicity of the drawing. It can be understood that this is only for illustration, and in different designs and applications, a number of interconnection layers may be formed as required.

In embodiments of the present disclosure, the wiring layer 122 is the topmost interconnection layer before forming the bonding hole, and the wiring layer may be a top metal layer. In the embodiment, a material of the wiring layer 122 may be copper. The wiring layer 122 is formed in the cover layer 120, and the cover layer 120 is made of a dielectric material for isolating the topmost wiring layer 122. The cover layer 120 may be in a single layer structure or a multilayer structure. In the embodiment, the cover layer 120 is in the single layer structure and may include a silicon oxide layer. A thickness of the silicon oxide layer 120 may be, for example, 10,000 Å.

The layer to be etched is further formed on the cover layer 120. The bonding hole is to be formed in the layer to be etched. The layer to be etched is made of a dielectric material and may include an adhesive layer for bonding. The adhesive layer may include a first adhesive layer 140 and a second adhesive layer 142 on the first adhesive layer. In some embodiments, the layer to be etched may further include a protective layer 146 on the second adhesive layer 142. The layer to be etched is used as a layer of bonding material to be bonded with other wafers, and also used as a layer for isolating the metallic material in the bonding hole.

The first adhesive layer 140 and the second adhesive layer 142 may be made of different bonding materials. The second adhesive layer 142 may be made of a bonding material having better properties. In the embodiment, the first adhesive layer 140 may be made of bonding silicon oxide, and the second adhesive layer 142 may be made of NDC (Nitrogen doped Silicon Carbide). The protective layer 146 is used to protect the adhesive layer, and may be made of silicon oxide. In an embodiment, thickness of the first adhesive layer 140, the second adhesive layer 142, and the protective layer 146 may be 10,000 Å, 1000 Å, and 2000 Å, respectively.

In the embodiment, a diffusion stop layer 130 may be further formed between the cover layer 120 and the first adhesive layer 140. The diffusion stop layer 130 covers the cover layer 120 and the wiring layer 122 to avoid sputtering and diffusion of the metal material of the wiring layer 122 during etching. In an embodiment, a material of the diffusion stop layer 130 may be silicon nitride and a thickness of the diffusion stop layer 130 may be 750 Å.

Figure 2:
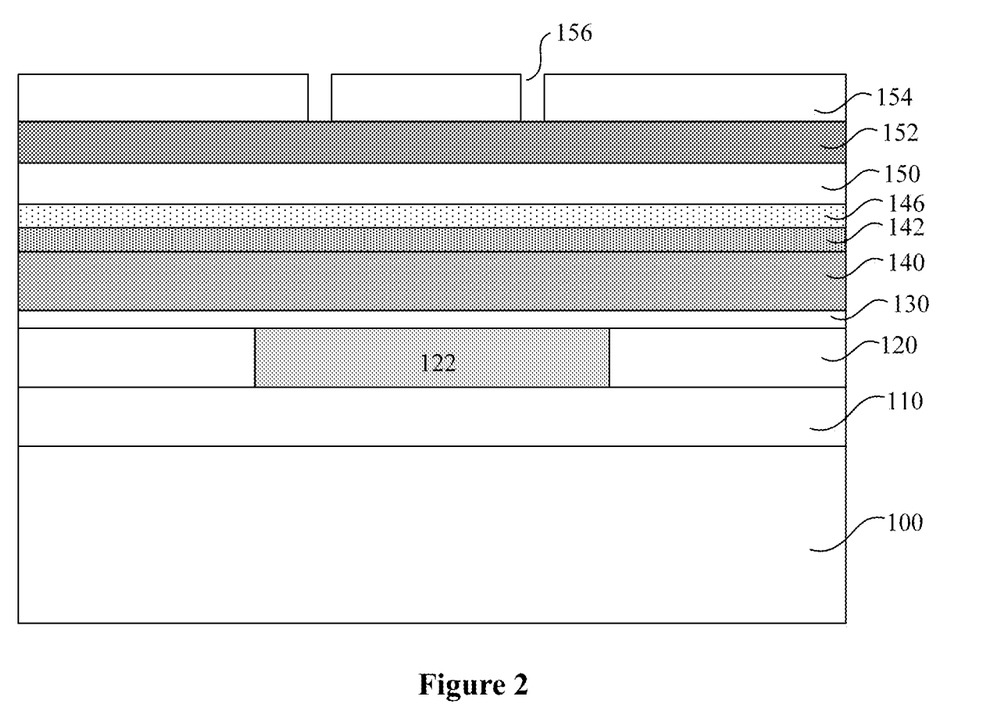
FIGS. 2-11 are schematic diagrams of structures formed in a method for manufacturing a semiconductor device according to an embodiment of the present disclosure.
Figure 3:
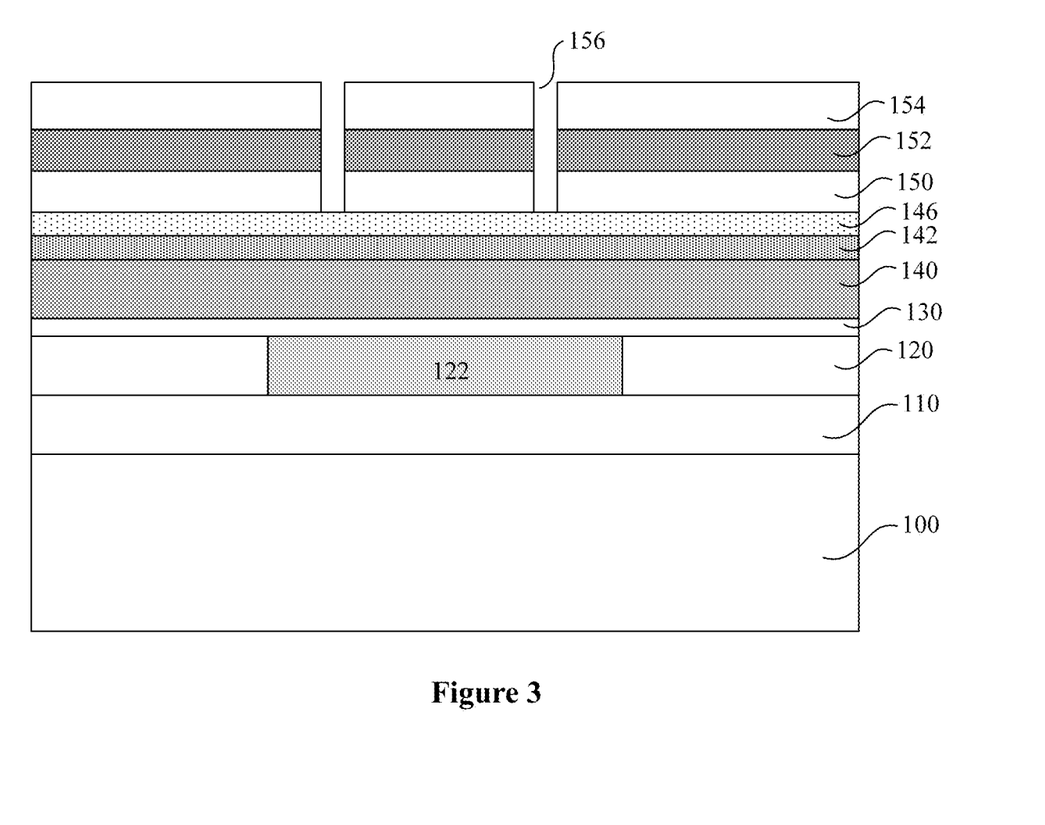

In step S102, an exposure patterned film layer 150, 154 is formed on the layer to be etched and a photolithography process is performed to form a first etching hole pattern 156 in the exposure patterned film layer 150, 154, as shown in FIG. 2 and FIG. 3.

The exposure patterned film layer 150, 154 may be formed on the layer to be etched. In some embodiments, the exposure patterned film layer 150, 154 may be formed on the second adhesive layer 142. In a case that the protective layer 146 is formed on the second adhesive layer 142, the exposure patterned film layer 150, 154 are formed on the protective layer 146 as shown in FIG. 2. The exposure patterned film layer may be made of a mask material that can be used for the patterning process by exposure, and may be in a single layer or a stacked structure. In some embodiments of the present disclosure, the exposure patterned film layer may be made of a mask material that can transfer a pattern by exposure, such as a photoresist material or the like. In some embodiments, the exposure patterned film layer may include an amorphous carbon mask layer 150 and a photoresist layer 154 on the amorphous carbon mask layer 150. A material of the amorphous carbon mask layer may be a carbon-rich organic condensed compound, such as an Advanced Patterning Film (APF), an Organic Under Layer (ODL) or Spin on Carbon (SoC). The material of the amorphous carbon mask layer 150 is harder than the photoresist material, and has the characteristics of a mask, as the photoresist material. The amorphous carbon mask layer 150 can be removed in a lateral direction by a trimming process, which can avoid excessive consumption thereof during an etching process, while being used as the mask.

In some embodiments, a photolithography technique is utilized. The photolithography process includes steps of baking, exposure, development, and the like. A pattern in a reticle is transferred into the photoresist layer 154 by the photolithography process to form the first etching hole pattern 156 in the photoresist layer 154, as shown in FIG. 2. The first etching hole pattern 156 in the photoresist layer may be transferred into the amorphous carbon mask layer 150 by using the photoresist layer 154 as a mask, thereby forming the etching hole pattern 156 extending through the amorphous carbon mask layer 150 and the photoresist layer 154 in the exposure patterned film layer.

A DARC (Dielectric Anti-reflective Coating) layer 152 may also be formed between the amorphous carbon mask layer 150 and the photoresist layer 154. The DARC layer 152 can protect the underlying amorphous carbon mask layer 150 in the subsequent etching processes, avoiding the consumption of the amorphous carbon mask layer 150 in a vertical direction in the subsequent processes. In this case, the first etching hole pattern 156 in the photoresist layer 154 may be transferred into the DARC layer 152 and the amorphous carbon mask layer 150 by using the photoresist layer 154 as a mask, thereby forming the etching hole pattern 156 extending through the carbon mask layer 150, the DARC layer 152 and the photoresist layer 154, as shown in FIG. 3.

In step S103, a first etching process is performed on the layer to be etched to form a blind hole 147 in the layer to be etched by using the exposure patterned film layer 150, 154 as a mask.

Figure 4:
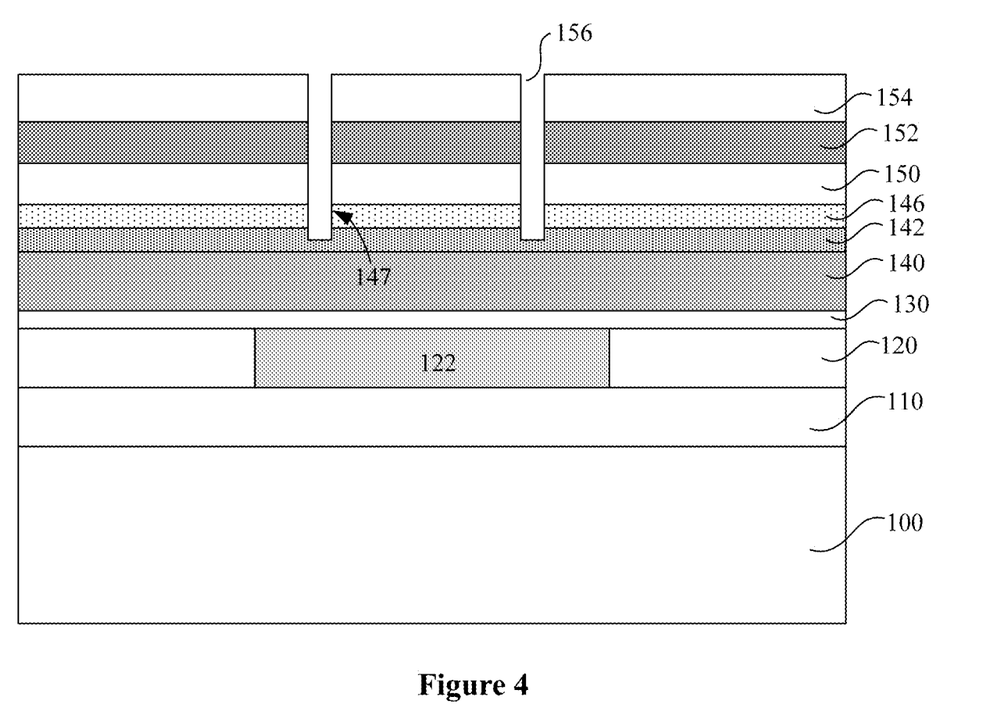

After the exposure patterned film layer 150, 154 is formed, the first etching process is performed on the layer to be etched by using the exposure patterned film layers 150, 154 as a mask, to remove the part of the layer to be etched under the first etching hole pattern 156 to form the blind hole 147 in the layer to be etched, as shown in FIG. 4. A diameter of the formed blind hole 147 is substantially identical to a diameter of the first etching hole pattern 156.

In the first etching process, the second adhesive layer 142 may be used as an etch stop layer, or the second adhesive layer 142 may be over-etched to remove the material of a upper portion of the second adhesive layer 142, as shown in FIG. 4. It should be noted, in a case that no protective layer 146 is formed on the second adhesive layer 142, the second adhesive layer 142 may be over-etched to remove the material of the upper portion of the second adhesive layer 142, forming a recess on the second adhesive layer 142 as the blind hole 147. In a case that the protective layer 146 is formed on the second adhesive layer 142, the second adhesive layer 142 may be used as the etch stop layer, and the formed blind hole 147 may extend through the protective layer 146. Alternatively, the second adhesive layer 142 may also be over-etched in this case, and the formed blind hole 147 extends through the protective layer 146 and extends through a part of thickness of the second adhesive layer 142, as shown in FIG. 4.

After the first etching process on the layer to be etched, the photoresist layer 154 may be consumed and removed, and the remaining amorphous carbon mask layer 150 and the DARC layer 152 on the amorphous carbon mask layer 150 may serve as a hard mask layer in the subsequent etching process. So far, only one photolithography process using the photoresist layer 154 is performed.

Figure 5:
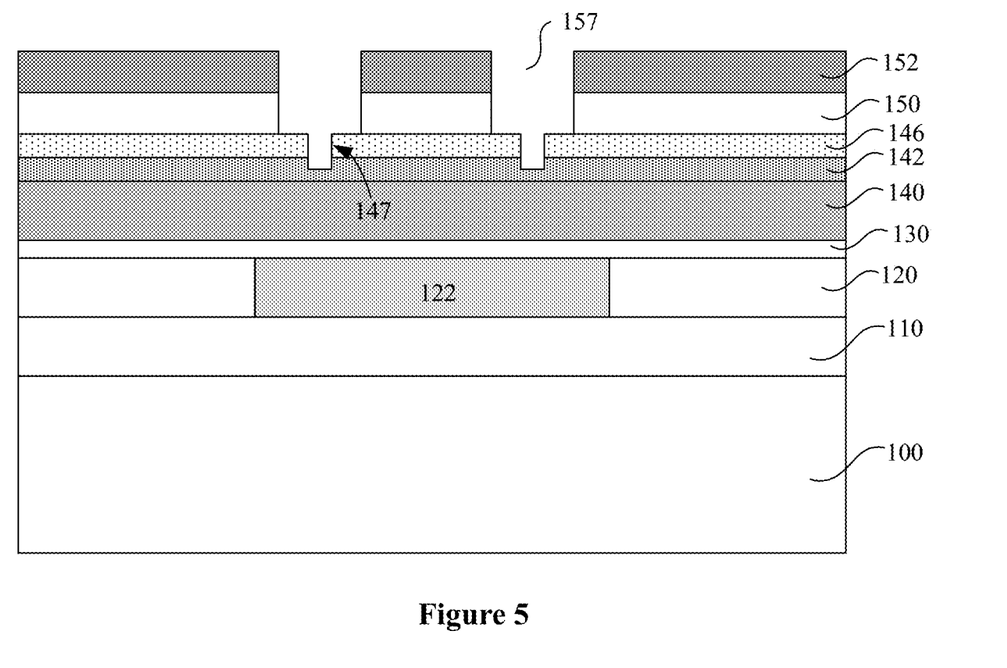

In step S104, the exposure patterned film layer 150 is trimmed to expand the first etching hole pattern 156 to form a second etching hole pattern 157, as shown in FIG. 5.

After the blind hole 147 is formed in the layer to be etched, the exposure patterned film layer 150 may be trimmed to enlarge the first etching hole pattern 156 to form the second etching hole pattern 157, as shown in FIG. 5. In the trimming process, lateral etching is achieved by using oxygen as main etching gas. Oxygen has a very high etching selectivity for dielectric materials such as silicon oxide, and has a high rate of etching the carbide, so that lateral sidewall can be etched. The exposure patterned film layer 150 on the sidewall of the first etching hole pattern 156 is removed in the lateral direction, thereby expanding the first etching hole pattern 156 such that a diameter of the formed second etching hole pattern 157 is larger than the diameter of the first etching hole pattern 156.

In a case that the DARC layer 152 is formed on the amorphous carbon mask layer 150, the trimming process on the exposure patterned film layer 150 includes trimming the amorphous carbon mask layer 150 and the DARC layer 152. The formed second etching hole pattern 157 extends through the amorphous carbon mask layer 150 and the DARC layer 152, and the diameter of the second etching hole pattern 157 is larger than the diameter of the blind hole 147, as shown in FIG. 5.

After the exposure patterned film layer 150 is trimmed, the second etching hole pattern 157 having a larger diameter is formed in the exposure patterned film layer 150, and the blind hole 147 is formed in the layer to be etched. As can be seen from the above, the blind hole may be a recess located in the second adhesive layer 142, or may extend through only the protective layer 146, or may extend through the protective layer 146 and extend through a part of thickness of the second adhesive layer 142.

In step S105, a second etching process is performed on the layer to be etched to form a bonding hole by using the trimmed exposure patterned film layer 150 as a mask, as shown in FIGS. 6-11.

Figure 11:
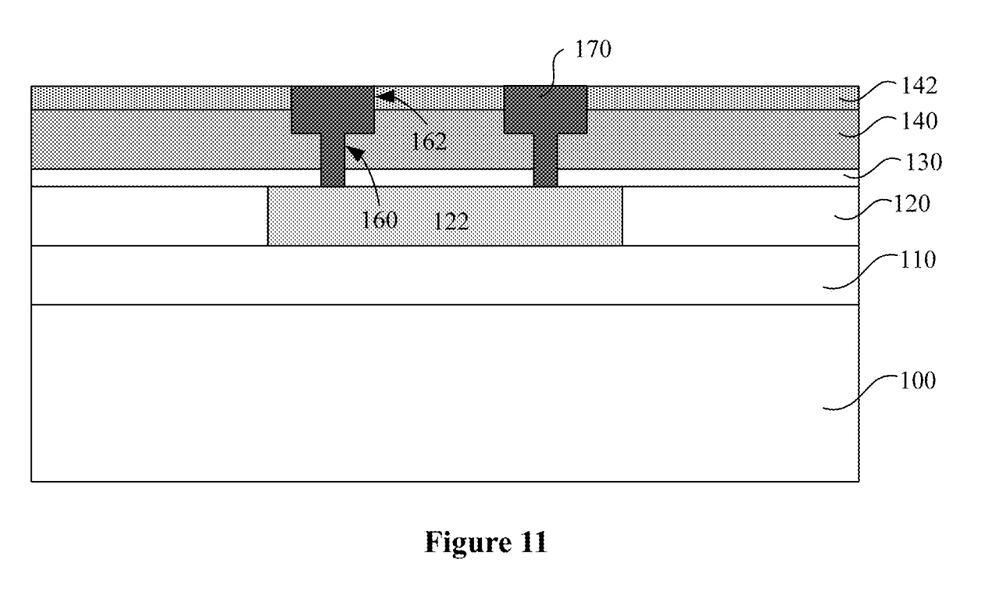

The second etching process may be performed on the layer to be etched to form the bonding hole 160, 162 by using the trimmed exposure patterned film layer 150 as the mask. The blind hole 147 having a small diameter is formed in the layer to be etched. The blind hole 147 is used in the layer-by-layer etching process on the layer to be etched. An etching hole 147' extending to the wiring layer 122 is formed under the blind hole 147, thereby forming a bottom via hole 160 having a diameter substantially the same as the diameter of the blind via hole 147. Since the second etching hole pattern 157 having a larger diameter is formed in the exposure patterned film layer 150, by using the exposure patterned film layer 150 as a mask, an upper via hole 162 having a diameter substantially the same as the diameter of the second etching hole pattern 157 may be formed in the layer to be etched during the etching process. The upper via hole 162 has a larger diameter than the bottom via hole 160. That is, in the embodiment of the present disclosure, the formed bonding hole may include both a bottom via hole 160 formed by using the blind hole 147 and extending to the wiring layer, and the upper via hole 162 extending through a part of thickness of the layer to be etched between the bottom via hole 160 and the second etching hole pattern 157, as shown in FIG. 11.

In different applications, the layer to be etched may have different structures and materials, and the blind hole may have different depths. In a case that the layer to be etched is in a stacked structure, the second etching process may include multiple etching steps, which may be determined according to actual requirements. An example of the second etching process is described in detail below. In the example, the layer to be etched includes the first adhesive layer 140, the second adhesive layer 142 and the protective layer 146, which are made of silicon oxide, NDC and silicon oxide, respectively. In the example, the blind hole 147 formed in the step S103 extends through the protective layer 146 and extends through a part of thickness of the second adhesive layer 142, as shown in FIG. 4.

Figure 6:
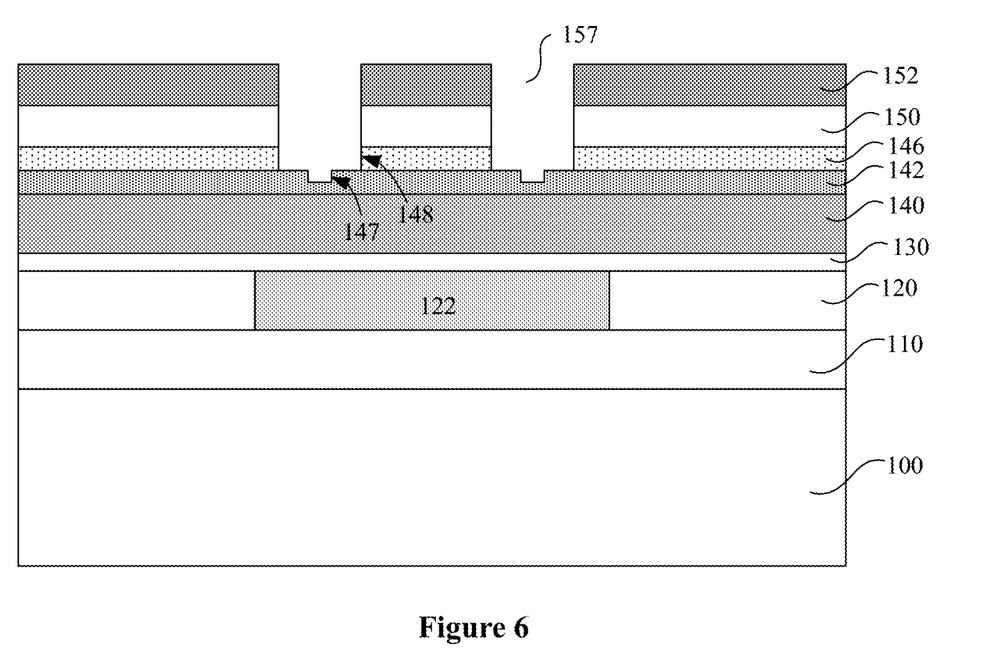

First, the protective layer 146 may be etched by using the trimmed exposure patterned film layer 150 as a mask to transfer the second etching hole pattern 157 to the protective layer 146, where the etching of the protective layer 146 may be performed by anisotropic dry etching. In some embodiments, the etching may be performed by RIE (Reactive Ion Etching). An etching gas may include C4F8, Ar, O2 and/or CO, which has an etch selectivity to the second adhesive layer 142. The second adhesive layer 142 may be used as an etch stop layer, to pattern and etch the protective layer 146, to form an etched opening 148 in the protective layer, as shown in FIG. 6.

Then, the second adhesive layer 142 may be etched. In some embodiments, the second adhesive layer 142 is etched by using a gas having the etch selectivity to the first adhesive layer 140, using the first adhesive layer 140 as an etch stop layer, and using the trimmed exposed patterned layer 150 as a mask. The etching may be performed by anisotropic dry etching, such as RIE (Reactive Ion Etching). The etching gas may include $CF_4$, $CH_2F_2$, $CHF_3$ and/or $O_2$.

Figure 7:
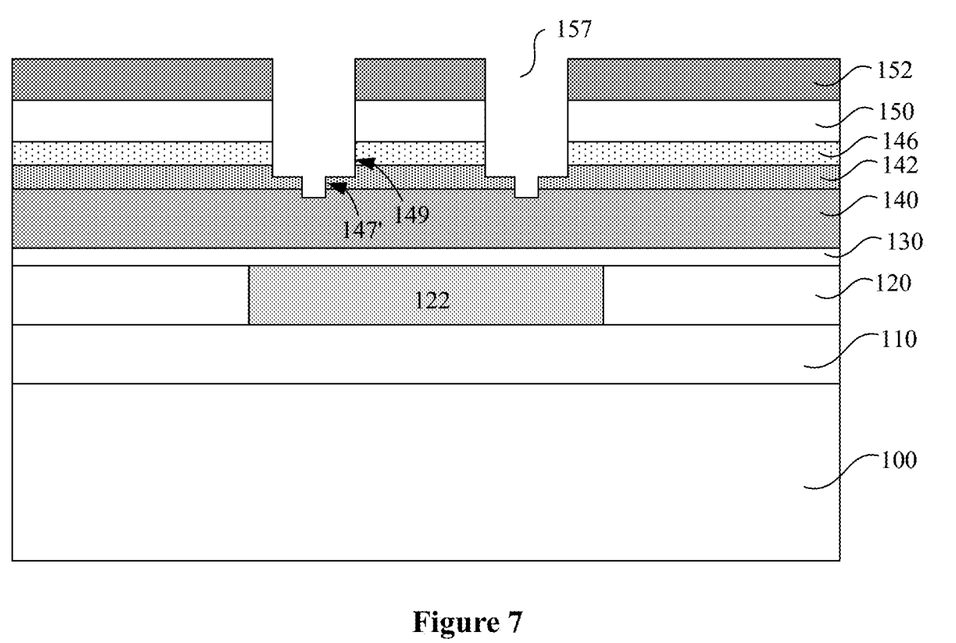

In the process of etching the second adhesive layer 142, since the pattern of the blind hole 147 has been formed in the second adhesive layer 142, the second adhesive layer 142 at the bottom of the blind hole 147 is first etched away due to its thinness, which increases the depth of the blind hole 147. That is, the etching hole 147' is formed under the blind hole 147. When the etching hole 147' extends to the first adhesive layer 140, the etching of the second adhesive layer 142 may be stopped. The second adhesive layer 142 may be remained at the area around the blind hole 147 that is not covered by the exposure patterned film layer 150, and an upper opening 149 is formed at the area where the second adhesive layer 142 has been removed, as shown in FIG. 7.

In addition, during the etching of the second adhesive layer 142, a certain loss may be caused to the first adhesive layer 140 under the blind hole, so that the first adhesive layer 140 under the blind via hole 147 is over-etched. Thereby, the etching hole 147' further extends through a part of thickness of the first adhesive layer 140, as shown in FIG. 7.

Figure 8:
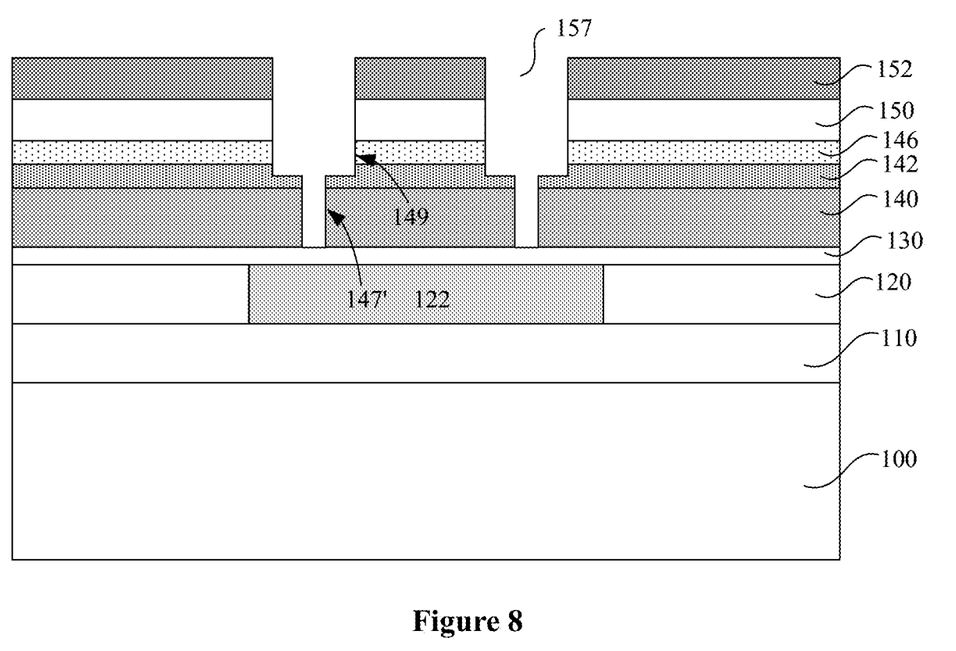

Thereafter, the first adhesive layer 140 may be further etched, and the etching has an etch selectivity to the second adhesive layer 142. The first adhesive layer 140 exposed by the etching hole 147' may be further removed to further deepen the etching hole 147' under the blind hole 147. In a case that the diffusion stop layer 130 is formed between the cover layer 120 and the first adhesive layer 140, the deepened etching hole 147' may extend to the diffusion stop layer 130, as shown in FIG. 8. The first adhesive layer 140 may be etched by an anisotropic dry etching method, such as RIE (Reactive Ion Etching). The etching gas may include $C_4F_6$, Ar, $O_2$, CO or the like.

Figure 9:
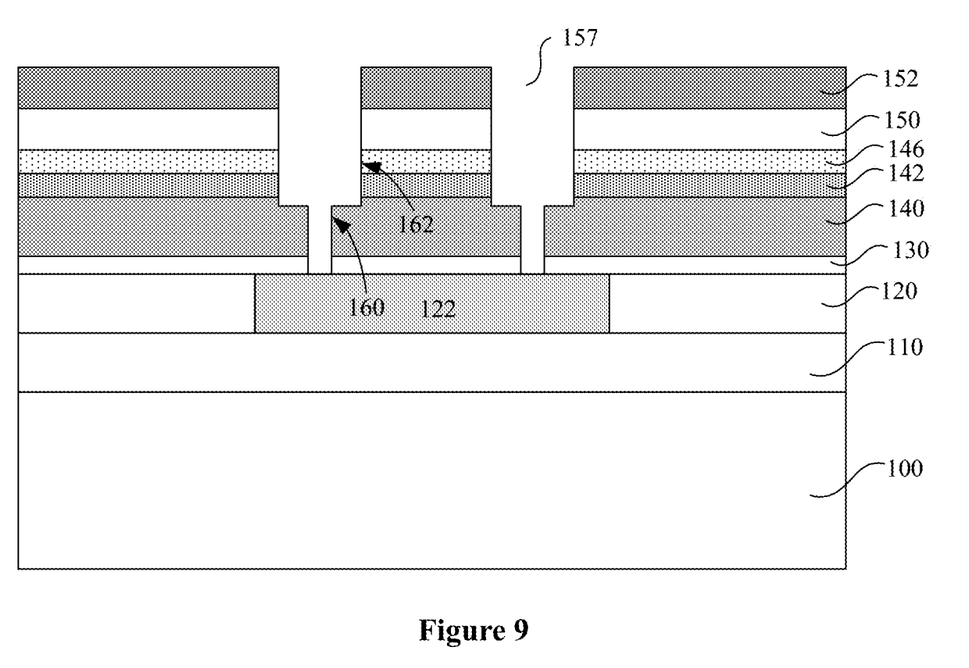

Finally, after forming the etching hole 147' extending to the diffusion stop layer 130, the diffusion stop layer 130 at the bottom of the etching hole 147' may be further etched, so that the etching hole 147' extends to the interconnection layer 122, thereby forming the bottom via hole 160 under the blind hole 147. In some embodiments, the diffusion stop layer 130 may be etched by using the second adhesive layer 142 as a mask and using the interconnection layer 122 as an etch stop layer. The diameters of the formed bottom via hole 160 and the blind hole 147 are substantially the same, as shown in FIG. 9.

In the embodiments, the second adhesive layer 142 may also be etched by using the trimmed exposure patterned film layer 150 as a mask. That is, the second adhesive layer 142 under the upper opening 149 is etched to form the upper via hole 162 under the upper opening 149. The upper via hole 162 is located above the bottom via hole 160 and has a substantially same diameter as the second etched pattern 157, as shown in FIG. 9. In order to increase the depth of the upper via hole 162, the first adhesive layer 140 at the bottom of the upper via hole 162 may also be etched. As an example, a thickness of the remained first adhesive layer 140 is 4500-5500 Å.

In this example, the material of the diffusion stop layer 130 is silicon nitride, and the materials of the second adhesive layer 142 and the first adhesive layer 140 are NDC and silicon oxide, respectively. By selecting a suitable etching gas, while etching the diffusion stop layer 130 under the blind hole 147, the second adhesive layer 142 under the upper opening 149 may be removed and the first adhesive layer 140 is further etched, so that the formed upper via hole 162 extends through a part of thickness of the first adhesive layer 140, and the formed bottom via hole 160 extends to the wiring layer 122. In the etching step, the dielectric anti-reflective layer 152 and the amorphous carbon mask layer 150 may be removed.

To this end, the bottom via hole 160 extending to the interconnection layer 122 is formed, and the upper via hole 162 having a depth less than the thickness of the layer to be etched is formed in the layer to be etched between the bottom via hole 160 and the second etching hole pattern 157. The bottom via hole 160 and the upper via hole 162 together form the bonding hole. Thereby, the second etching process on the layer to be etched is completed, and the bonding hole 160, 162 are formed.

Figure 10:
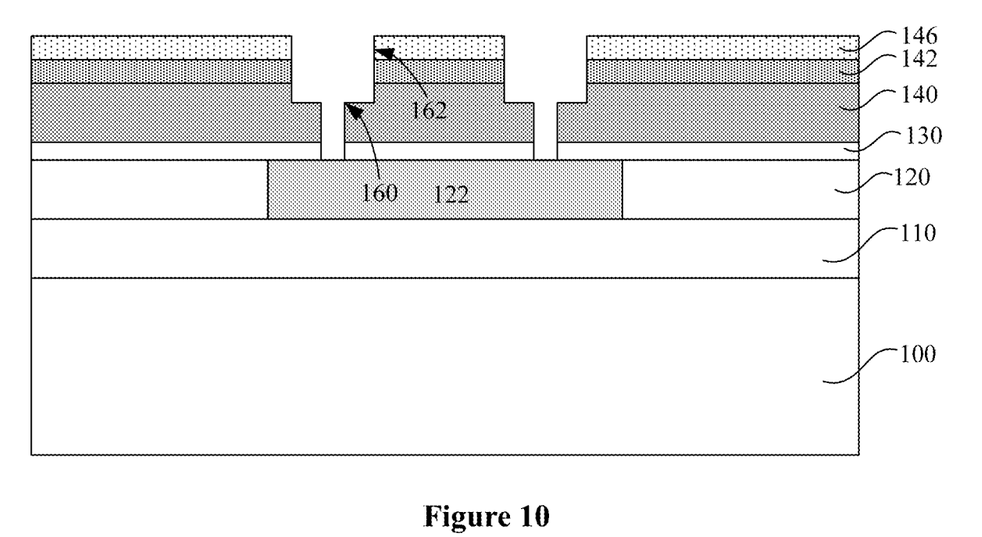

It can be understood that, in the second etching process, the trimmed exposure patterned film layer 150 is used as a mask, and the dielectric anti-reflective layer 152 in the exposure patterned film layer 150 protects the amorphous carbon film layer 150 below the dielectric anti-reflective layer 152. The dielectric anti-reflective layer 152 may be consumed in the etching process. The dielectric anti-reflective layer 152 may be removed before, during or after the second etching process. After the second etching process, since the mask is no longer needed, the amorphous carbon film layer 150 may be removed, as shown in FIG. 10.

In step S106, a bonding pad 170 is formed in the bonding hole 160, 162, as shown in FIG. 11.

Thereafter, other processes may be performed. For example, the bonding hole 160, 162 are filled with a metal material, which may be copper. Then a planarization process, such as a chemical mechanical planarization process, is performed. Thus, the upper via hole 162 and the bottom via hole 160 will be filled with the metal material. The upper via hole 162 filled with the metal material is used as a bonding structure and an electrical connection structure, and the bottom via hole 160 filled with the metal material will be used to electrically connect the pad with the wiring layer 122. In the planarization process, the protective layer 146 in the layer to be etched may also be removed together with a portion of the second adhesive layer 142, so that the surface flatness of the second adhesive layer 142 reaches the requirement of a bonding process, as shown in FIG. 11. In some embodiments, the thickness of the second adhesive layer 142 that is remained may range from 600 to 700 Å, and a flatness error of the flattened surface may range from 0 to 100 Å.

The method for manufacturing a semiconductor device is provided in embodiments of the present disclosure. In the method, a substrate is provided, where a cover layer of a dielectric material is formed on the substrate, a wiring layer is formed in the cover layer, a layer to be etched is formed on the cover layer. The layer to be etched includes an adhesive layer. In the method, an exposure patterned film layer is formed on the layer to be etched. A first etching hole pattern is formed in the exposure patterned film layer. A first etching process is performed on the layer to be etched to form a blind hole in the layer to be etched by using the exposure patterned film layer as a mask. The exposure patterned film layer is trimmed to expand the first etching hole pattern to form a second etching hole pattern. A second etching process is performed on the layer to be etched to form a bonding hole by using the trimmed exposure patterned film layer as a mask. A bonding pad is formed in the bonding hole. That is, by the method of the embodiments of the present disclosure, the bonding hole can be formed by etching after performing only one photolithography process to form the first etching hole pattern on the exposed patterned film layer and performing only one trimming process to form the second etching hole pattern on the exposed patterned film layer. Compared with the conventional techniques, which require two photolithography processes with two masks, the number of photolithography processes is reduced, thereby reducing the manufacturing cost and improving the productivity and efficiency.

The embodiments of the present disclosure are described in a progressive manner, and each embodiment places emphasis on the difference from other embodiments. Therefore, the embodiments may be referred to each other for the same or similar parts.

The foregoing embodiments are only preferred embodiments of technical solutions in the present disclosure. The preferred embodiments are disclosed above, but they are not intended to limit the present disclosure. With the method and technical content disclosed above, those skilled in the art can make some variations and improvements to the technical solutions of the present disclosure, or make some equivalents on the embodiments without departing from the scope of technical solutions of the present disclosure. All simple modifications, equivalent variations and improvements made based on the technical essence of the present disclosure without departing from the content of the technical solutions of the present disclosure fall within the protection scope of the technical solutions of the present disclosure.

The invention claimed is:

1. A method for manufacturing a bonding pad in a semiconductor device, comprising:

providing a substrate, wherein a cover layer of a dielectric material is formed on the substrate, a wiring layer is formed in the cover layer, a layer to be etched is formed on the cover layer, and the layer to be etched comprises an adhesive layer;

forming an exposure patterned film layer on the layer to be etched and performing a photolithography process to form a first etching hole pattern in the exposure patterned film layer;

performing a first etching process on the layer to be etched to form a blind hole in the layer to be etched by using the exposure patterned film layer as a mask;

trimming the exposure patterned film layer to expand the first etching hole pattern to form a second etching hole pattern;

performing a second etching process on the layer to be etched to form a bonding hole by using the trimmed exposure patterned film layer as a mask, wherein the bonding hole comprises a bottom via hole and an upper via hole, the bottom via hole is formed by using the blind hole and extends to the wiring layer, the upper via hole extends through a part of thickness of the layer to be etched and is formed in the layer to be etched between the bottom via hole and the second etching hole pattern; and forming a bonding pad in the bonding hole;

wherein the adhesive layer comprise a first adhesive lever and a second adhesive layer on the first adhesive layer, and the layer to be etched further comprises a protective layer on the second adhesive layer;

wherein a diffusion stop layer is formed between the first adhesive layer and the cover layer;

wherein after the first etching process, the blind hole extends through the protective layer, and extends through a part of thickness of the second adhesive layer; and wherein the second etching process comprises:
- transferring the second etching hole pattern to the protective layer;
- etching the second adhesive layer until the blind hole extends to the first adhesive layer, and forming an upper opening extending through a part of thickness of the second adhesive layer around the blind hole;
- etching the first adhesive layer under the blind hole until the blind hole extends to the diffusion stop layer; and
- etching the second adhesive layer under the upper opening to form the upper via hole, and etching the diffusion stop layer under the blind hole to form the bottom via hole.

2. The method according to claim 1, wherein the exposure patterned film layer comprises an amorphous carbon mask layer and a photoresist layer on the amorphous carbon mask layer.

3. The method according to claim 2, wherein the amorphous carbon mask layer is made of an Advanced Patterning Film (APF), an Organic Under Layer (ODL) or Spin on Carbon (SoC).

4. The method according to claim 2, wherein a dielectric anti-reflective layer is arranged between the amorphous carbon mask layer and the photoresist layer;
wherein before or during the second etching process, the method further comprises:
removing the dielectric anti-reflective layer.

5. The method according to claim 4, wherein the photoresist layer is removed in the first etching process.

6. The method according to claim 1, wherein a material of the first adhesive layer is silicon oxide, a material of the second adhesive is Nitrogen doped Silicon Carbide (NDC), and a material of the protective layer is silicon oxide.

* * * * *